(12) United States Patent
Cao et al.

(10) Patent No.: US 11,348,213 B2
(45) Date of Patent: May 31, 2022

(54) MULTISTAGE PROCESS MODEL TRAINING

(71) Applicant: International Business Machines Corporation, Armonk, NY (US)

(72) Inventors: Li Cao, Bei Jing (CN); Ze Ming Zhao, Bei Jing (CN); Wu Song Fang, Bei Jing (CN); Cheng Fang Wang, Bei Jing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 345 days.

(21) Appl. No.: 16/788,334

(22) Filed: Feb. 12, 2020

(65) Prior Publication Data
US 2021/0248726 A1    Aug. 12, 2021

(51) Int. Cl.
*G06T 5/40*     (2006.01)
*G06T 5/50*     (2006.01)
(Continued)

(52) U.S. Cl.
CPC ............ *G06T 5/40* (2013.01); *G06F 30/27* (2020.01); *G06N 20/00* (2019.01); *G06T 5/50* (2013.01); *G06T 2207/10024* (2013.01)

(58) Field of Classification Search
CPC ... G06T 5/40; G06T 5/50; G06T 2207/10024; G06T 2207/10016; G06T 2207/30148;
(Continued)

(56) References Cited

U.S. PATENT DOCUMENTS 5,982,927 A * 11/1999 Koljonen .................. G06T 7/33
                                                       382/168
6,614,924 B1 * 9/2003 Aghajan .......... G01N 21/95607
                                                       382/168
(Continued)

OTHER PUBLICATIONS

Lin et al., "RefineNet: Multi-Path Refinement Networks for High-Resolution Semantic Segmentation." IEEE; Proceedings of the IEEE conference on computer vision and pattern recognition, 2017. 10 Pages.

(Continued)

*Primary Examiner* — Phuoc Tran
(74) *Attorney, Agent, or Firm* — Cantor Colburn LLP; Jeffrey Ingalls (57) ABSTRACT

Techniques for multistage process model training are described herein. Another aspect includes determining a first gray level histogram corresponding to a first input image. Another aspect includes determining a second gray level histogram corresponding to a second input image. Another aspect includes determining a set of change values, each change value corresponding to a change in a respective gray level from the first gray level histogram to the second gray level histogram. Another aspect includes comparing each change value of the set of change values to a threshold. Another aspect includes, based on determining that a first change value of the set of change values is higher than the threshold, adding a first gray level corresponding to the first change value to a hot zone of the second input image. Another aspect includes training a model using the hot zone of the second input image.

20 Claims, 5 Drawing Sheets

(51) Int. Cl.
*G06N 20/00* (2019.01)
*G06F 30/27* (2020.01)

(58) Field of Classification Search
CPC ......... G06T 7/001; G06F 30/27; G06F 30/20; G06N 20/00; G06N 3/08
See application file for complete search history.

(56) References Cited

U.S. PATENT DOCUMENTS

| | | | |
|---|---|---|---|
| 7,058,220 B2 * | 6/2006 | Obrador | G06T 5/40 382/218 |
| 2019/0228268 A1 | 7/2019 | Zhang et al. | |
| 2019/0333222 A1 | 10/2019 | Gatti | |

OTHER PUBLICATIONS

Pinheiro et al., "Learning to Refine Object Segments." European Conference on Computer Vision. Springer, Cham, 2016. 18 Pages.

* cited by examiner

MULTISTAGE PROCESS MODEL TRAINING

BACKGROUND

The present invention generally relates to system modeling, and more specifically, to multistage process model training.

Model construction and training may be used to create a model to simulate a process (for example, a manufacturing process) using a computer system. A trained system model may be used to detect errors in the process. Images taken from the process may be used to train a system model that operates using visual data. For example, an input image may be fed into the model during training, and the model may output a conclusion based on the input image. A current configuration of the model may be modified based on outputting an incorrect conclusion by the model, or the current configuration may be reinforced based on outputting a correct conclusion by the model. Training of the model may be determined to be complete based on, for example, a relatively high proportion of correct conclusions as compared to incorrect conclusions being output by the model based on a relatively large set of input images.

SUMMARY

Embodiments of the present invention are directed to multistage process model training. A non-limiting example computer-implemented method includes receiving a first input image and a second input image. The method also includes determining a first gray level histogram corresponding to the first input image. The method also includes determining a second gray level histogram corresponding to the second input image. The method also includes determining a set of change values, each change value of the set of change values corresponding to a change in a respective gray level from the first gray level histogram to the second gray level histogram. The method also includes comparing each change value of the set of change values to a threshold. The method also includes, based on determining that a first change value of the set of change values is higher than the threshold, adding a first gray level corresponding to the first change value to a hot zone of the second input image. The method also includes training a model to simulate a process using the hot zone of the second input image.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the present invention provide multistage process model training. A self-adaptive network model may be constructed to model a multiple stage manufacturing process, and the model may be used for quality testing and defect detection in the manufacturing process (e.g., a manufacturing process for precise instruments). A multistage manufacturing process may include a number of sequential stages, where each stage performs a defined task with regard to an item that is being produced by the manufacturing process. An item may be expected to have particular characteristics after each stage of the multistage manufacturing process. Modeling for quality testing and defect detection may require complex processing of images from the process in order to identify issues in the manufacturing process. For example, the images may have relatively high pixel density.

A set of images (i.e., a training sample) corresponding to the manufacture of a single item as the item proceeds through the manufacturing process may be used to train a self-adaptive network model of the process. Images corresponding to processing by different stages for a single sample may be grouped together in a training sample. In each sample, the images captured in different processing stages may include redundancies, as a significant portion of images for adjacent stages may be duplicated. Any areas of difference between images for adjacent stages (i.e., a hot zone) may be determined, and the hot zone of an image, as compared to a directly preceding stage, may be input into a portion of a model for a particular stage in order to target the training of the model for the particular stage. Determination of hot zone data may reduce of the size of the image data that is used to train the model, and may allow the model for each stage to focus on the parts of the image that have changed with respect to the previous stage, so that the training is targeted and thus, requires less training data. If the process is adjusted, the retraining of the model may also require relatively less time and effort through the use of hot zone data.

To identify the hot zone between two images corresponding to adjacent stages, a gray level histogram may be generated for each image. A difference between the values for each gray level in the two gray level histograms may be determined and compared to a threshold. If a change in a particular gray level for a particular stage with respect to a previous stage is greater than the threshold, any pixels corresponding to the particular gray level may be determined to be part of the hot zone of the image for the particular stage. Directly adjacent stages are compared using the gray-level histograms throughout the multistage process image data.

Figure 1:
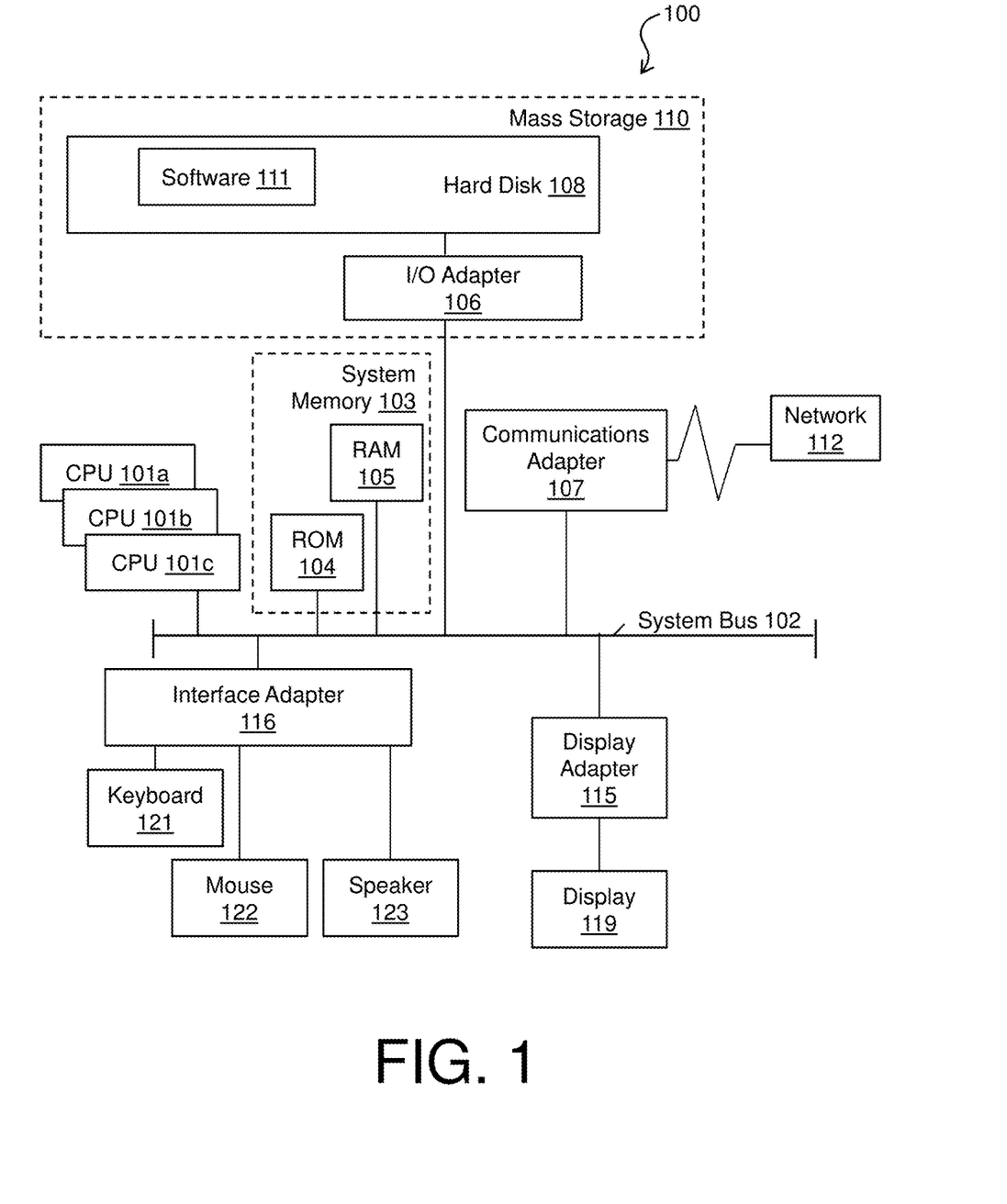
FIG. 1 is a block diagram of an example computer system for use in conjunction with one or more embodiments of multistage process model training.

Turning now to FIG. 1, a computer system 100 is generally shown in accordance with an embodiment. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc. (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system, such as the z/OS or AIX operating system from IBM Corporation, to coordinate the functions of the various components shown in FIG. 1.

Additional input/output devices are shown as connected to the system bus 102 via a display adapter 115 and an interface adapter 116 and. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by a display adapter 115, which may include a graphics controller to improve the performance of graphics intensive applications and a video controller. A keyboard 121, a mouse 122, a speaker 123, etc. can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
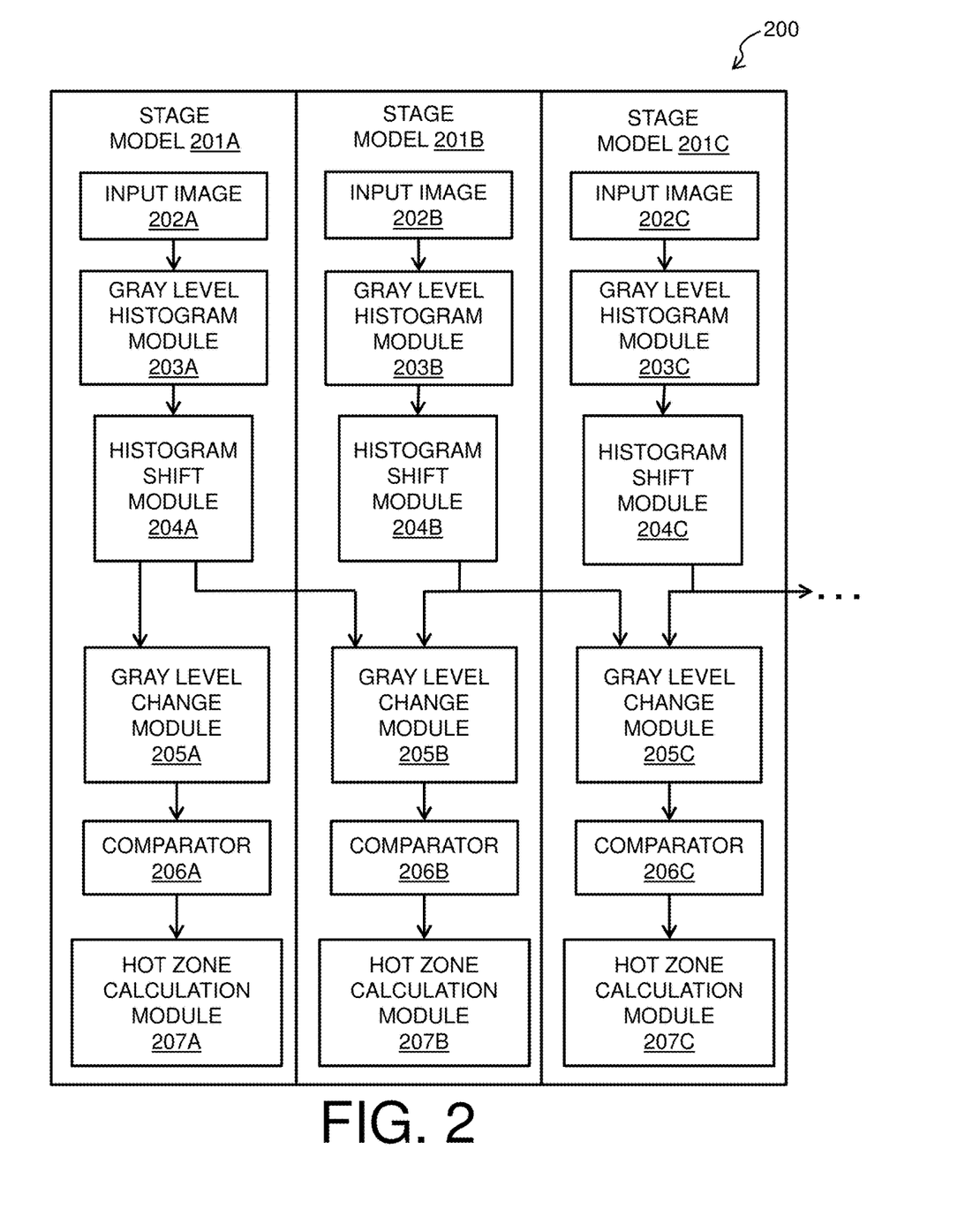
FIG. 2 is a block diagram of components of a system for multistage process model training in accordance with one or more embodiments of the present invention.

Turning now to FIG. 2, system 200 for multistage process model training is generally shown in accordance with one or more embodiments of the present invention. System 200 may be implemented in conjunction with any appropriate computer device, such as computer system 100 of FIG. 1. System 200 corresponds to a self-adaptive network model of a multistage manufacturing process, and includes process stage models 201A-C. An item being produced by the multistage manufacturing process starts in a first stage corresponding to stage model 201A, proceeds through a second stage corresponding to stage model 201B to a third stage corresponding to stage model 201C, and onward to any subsequent stages in the multistage manufacturing process. A multistage manufacturing process, and corresponding model such as is illustrated by system 200, may include any appropriate number of stages. Each stage corresponding to stage models 201A-C may perform a defined task with respect to the item.

A training sample, including input images 202A-C, may be input into the system 200. A training sample may include a number of images corresponding to a number of stages in the multistage manufacturing process. In some embodiments, each input image of the training sample including input images 202A-C may correspond to a single item that was produced by the multistage manufacturing process in the field. Input image 202A may be an image of an item after the processing corresponding to stage model 201A is complete; input image 202B may be an image of the same item after the processing corresponding to stage model 201B is complete; and input image 202C may be an image of the same item after the processing corresponding to stage model 201C is complete. Differences between images in the training sample for pairs of adjacent stages (i.e., input images 202A-B, and input images 202B-C) may be determined by system 200. An example of a training sample which may correspond to embodiments of input images 202A-C is illustrated with respect to FIG. 4, which is discussed below.

In each of stage models 201A-C, a gray level histogram module 203A-C determines a gray level histogram of the stage's respective input image 202A-C. A gray level histogram module 203A-C may determine a gray level value for each pixel in an image, and group pixels in the image according to the determined respective gray level values. A gray level histogram may include quantifier (e.g., a number of pixels) for each gray level for a set of gray levels that are identified in an image. Examples of gray level histograms that may be determined by gray level histogram modules 203A-C are illustrated with respect to FIG. 5, which is discussed below. The gray level histograms that are output by gray level histogram modules 203A-C are input to histogram shift modules 204A-C. In some embodiments, histogram shift modules 204A-C may correct the gray level histograms from respective gray level histogram modules 203A-C, and provide corrected gray level data to gray level change modules 205A-C. In some embodiments, the histogram shift modules 204A-C may convert the gray level histograms from Red Blue Green (RBG) format to Hue Saturation Value (HSV) format to reduce impact from shadows or lights in the input images 202A-C.

Gray level change modules 205A-C determine a change (e.g., a difference) in each gray level for histograms of adjacent stages. For example, for a histogram that classifies pixels in an image into 5 different gray levels, gray level change module 205B determines a change in each of the 5 gray levels from the gray level histogram corresponding to input image 202A to the gray level histogram corresponding to input image 202B. In some embodiments, gray level change module 205A in stage model 201A may determine a change in the gray level histogram corresponding to input image 202A with respect to a default or initial value (e.g., zero). The gray level change modules 205A-C output the determined gray level changes to respective comparators 206A-C.

The comparators 206A-C each receive a threshold. The threshold may have any appropriate value. In some embodiments, the threshold may be set by a user; in other embodiments, the threshold may be a default value. Each gray level change is compared to the threshold, and any gray level of the set of gray levels having a change that is above the threshold is output to hot zone calculation modules 207A-C. In some embodiments, an absolute value of each gray level change may be compared to the threshold by comparators 206A-C. Hot zone calculation modules 207A-C determines areas of the input images (e.g., input images 202B-C) that contain significant changes as compared to the input images corresponding to the directly preceding stage (e.g., input images 202A-B), and adds the determined areas to a hot zone. A hot zone of an image may be used to train a model of the multistage manufacturing process, allowing the model to focus on areas of the input image that are different with respect to a directly preceding stage. For example, the hot zone of input image 202B, which includes areas of input image 202B that are different with respect to input image 202A as determined based on their respective gray level histograms, may be used to train stage model 201B.

It is to be understood that the block diagram of FIG. 2 is not intended to indicate that the system 200 is to include all of the components shown in FIG. 2. Rather, the system 200 can include any appropriate fewer or additional components not illustrated in FIG. 2 (e.g., stages, input images, comparators, additional memory components, embedded controllers, functional blocks, modules, inputs, outputs, connections between stages, connections between modules, etc.). Further, the embodiments described herein with respect to system 200 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 3:
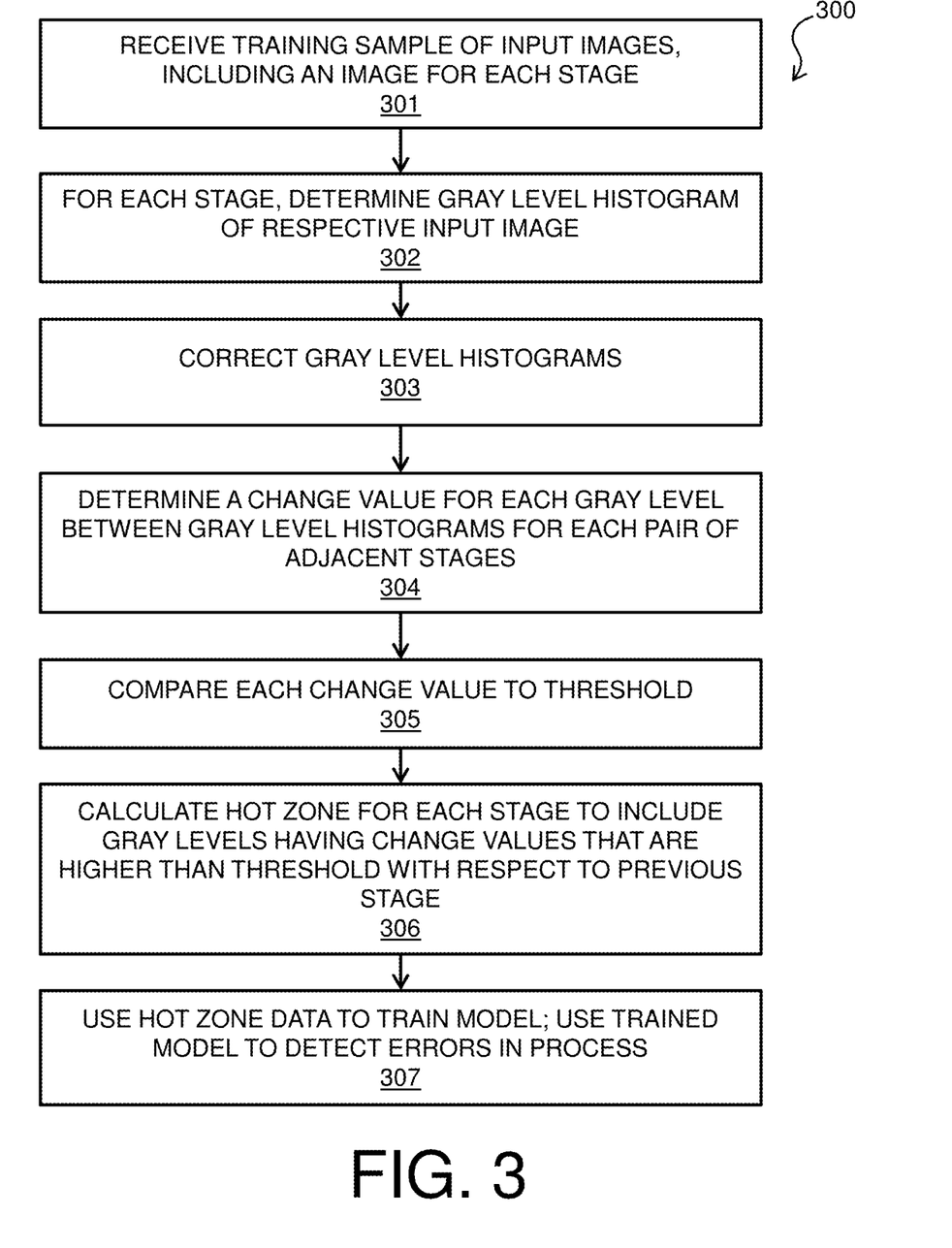
FIG. 3 is a flow diagram of a process for multistage process model training in accordance with one or more embodiments of the present invention.

FIG. 3 shows a process flow diagram of a method 300 for multistage process model training in accordance with one or more embodiments of the present invention. Method 300 may be implemented in conjunction with any appropriate computer device, such as computer system 100 of FIG. 1. Method 300 may be implemented in system 200 of FIG. 2. In block 301 of method 300, a training sample including a set of input images, each input image corresponding to a respective stage of a multistage manufacturing process, is received. In some embodiments, the training sample may correspond to processing of a single item by the multistage manufacturing process, and a number of images in the training sample may be equal to a number of stages in the multistage process. For example, input images 202A-C of FIG. 2 may be received in block 301 of method 300. An embodiment of a training sample that may be received in block 301 is illustrated with respect to FIG. 4, which is discussed below.

In block 302, a gray level histogram is constructed for each of the input images that was received in block 301 (for example, by gray level histogram modules 203A-C of FIG. 2). A gray level histogram of an image may include a set of different gray levels, each gray level having a respective value corresponding to a number of pixels in the input image that correspond to the gray level. An embodiment of gray level histograms that may be determined in block 302 is illustrated with respect to FIG. 5, which is discussed below.

In block 303, in some embodiments, the gray level histograms that were determined in block 302 may be shifted and/or corrected in order to, for example, reduce any effect from light or shadows in the input images. The processing of block 303 may be performed by histogram shift modules 204A-C. In some embodiments, the gray level histograms may be transformed from RBG format to HSV format in block 303. The transformation from RBG (red, blue, green) to HSV (hue, saturation, value) may be performed in block 303 according to Equations (EQs.) 1, 2, and 3:

$$V = \max(R, G, B); \quad (1)$$

$$S = \begin{cases} V - \dfrac{\min(R, G, B)}{V} & V \neq 0 \\ 0 & V = 0 \end{cases} ; \quad (2)$$

$$H = \begin{cases} \dfrac{60(G-B)}{S+V} & \max(R, G, B) = R \\ 120 + \dfrac{60(B-R)}{S+V} & \max(R, G, B) = G \\ 240 + \dfrac{60(R-G)}{S+V} & \max R, G, B) = B \end{cases} \quad (3)$$

In block 304, a change value (e.g., $\Delta_{gray\_level}$) is determined for each gray level with respect to pairs of gray level histograms corresponding to adjacent stages (by, for example, by gray level change modules 205A-C). The change values may be determined according to Equation (EQ) 4, wherein $h_{gray\_level}$ is a value given by a gray level histogram for a particular gray level, wherein x is a number of a stage for which the change value is being determined:

$$\Delta_{gray\_level} c = h_{gray\_level}(\text{Stage}(x)) - h_{gray\_level}(\text{Stage}(x-1)) \quad \text{EQ. 4.}$$

In block 305, each of the determined change values are individually compared to a threshold. The threshold may have any appropriate value. In some embodiments, the threshold may be a default value; in some embodiments, the threshold may be received from a user. In some embodiments, an absolute value of each change value may be compared to the threshold, such that a change comprising either an increase or a decrease in a particular gray level that is larger than the threshold may be added to the hot zone. The comparisons of block 305 may be performed by comparators 206A-C of FIG. 2. In block 306, hot zone data is determined for each image based on the comparison of block 305. The hot zone determination of block 306 may be performed by hot zone calculation modules 207A-C of FIG. 2. Gray levels may be added to a hot zone of an image according to EQ. 5:

$$\text{hot\_zone} = U_{\Delta_{gray\_level} c > threshold} \text{ gray\_level} \quad \text{EQ. 5.}$$

In block 307, the hot zone data is used to train a self-adaptive network model corresponding to the multistage manufacturing process. Use of the hot zone data may allow the training of the model for each stage of the multistage manufacturing process to ignore redundant image data and focus on image data that is different with respect to a directly preceding stage of the process, i.e., portions of the image that correspond to gray levels having a change that was higher than the threshold. The trained self-adaptive network model may be used to detect errors in the multistage manufacturing process through, for example, monitoring or simulating the multistage manufacturing process. A specific stage in the multistage manufacturing process in which an error is introduced may be identified using a model that is trained using method 300 of FIG. 3. Method 300 of FIG. 3 may be repeated for any appropriate number of training samples for training of a self-adaptive network model corresponding to a multistage manufacturing process.

The process flow diagram of FIG. 3 is not intended to indicate that the operations of the method 300 are to be executed in any particular order, or that all of the operations of the method 300 are to be included in every case. Additionally, the method 300 can include any suitable number of additional operations.

Figure 4:
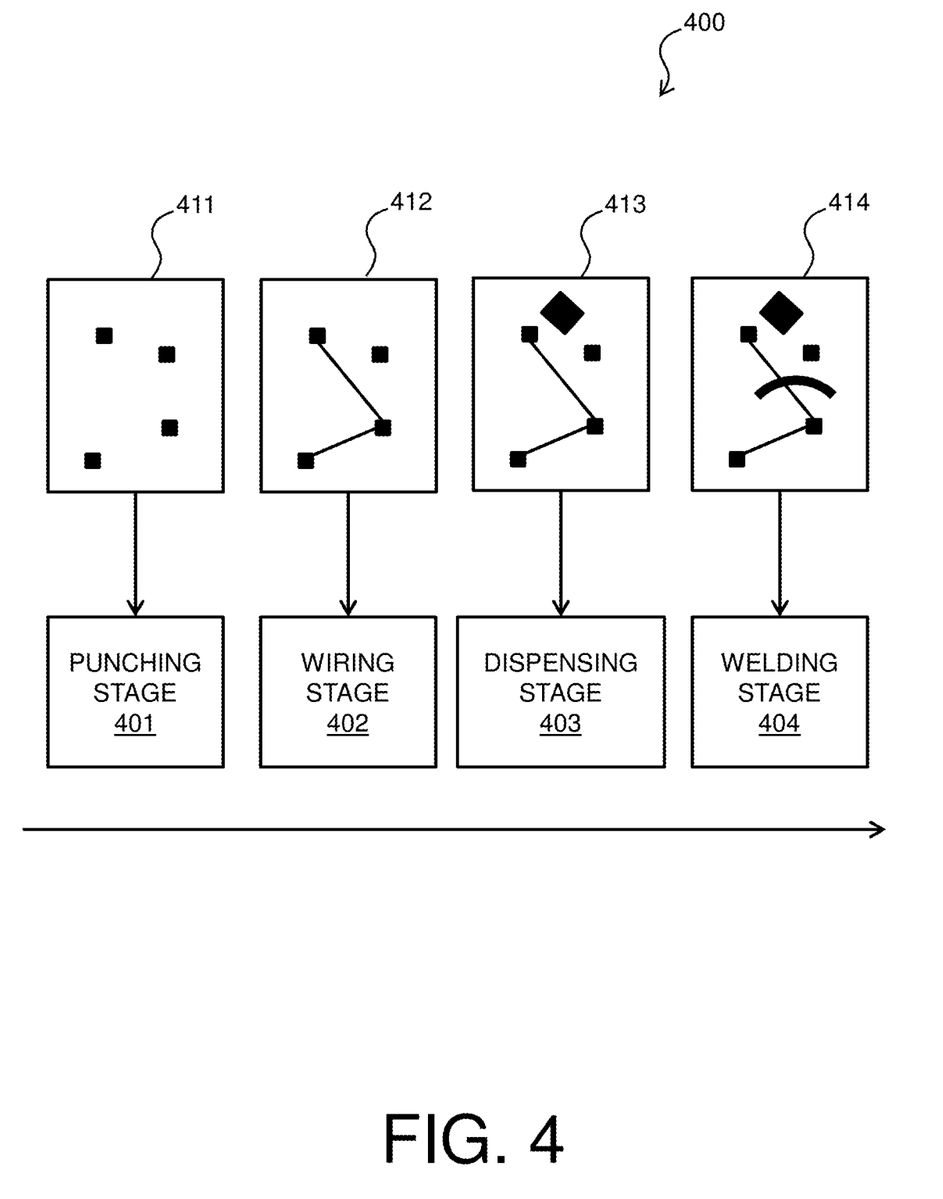
FIG. 4 is a block diagram of components of a multistage process and a training sample for multistage process model training in accordance with one or more embodiments of the present invention.

Turning now to FIG. 4, system 400 including a multistage process and training sample for multistage process model training is generally shown in accordance with one or more embodiments of the present invention. The multistage process of system 400 includes an initial punching stage 401, and proceeds through a wiring stage 402, dispensing stage 403, and welding stage 404. Images 411-414 each correspond to a respective stage of stages 401-404. Differences between pairs of images corresponding to adjacent stages (e.g., images 411 and 412, images 412 and 413, and images 413 and 414) may be determined by system 200 of FIG. 2 using method 300 of FIG. 3 to identify hot zone data to be used for model training to construct a self-adaptive network model of the multistage manufacturing process. For example, image 411 may correspond to image 202A; image 412 may correspond to image 202B, image 413 may correspond to image 202C, and image 414 may correspond to an image for a subsequent process stage model 201D (not shown).

It is to be understood that the block diagram of FIG. 4 is not intended to indicate that the system 400 is to include all of the components shown in FIG. 4. Rather, the system 400 can include any appropriate fewer or additional components not illustrated in FIG. 4 (e.g., stages, images, additional memory components, embedded controllers, functional blocks, connections between functional blocks, modules, inputs, outputs, etc.). Further, the embodiments described herein with respect to system 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 5:
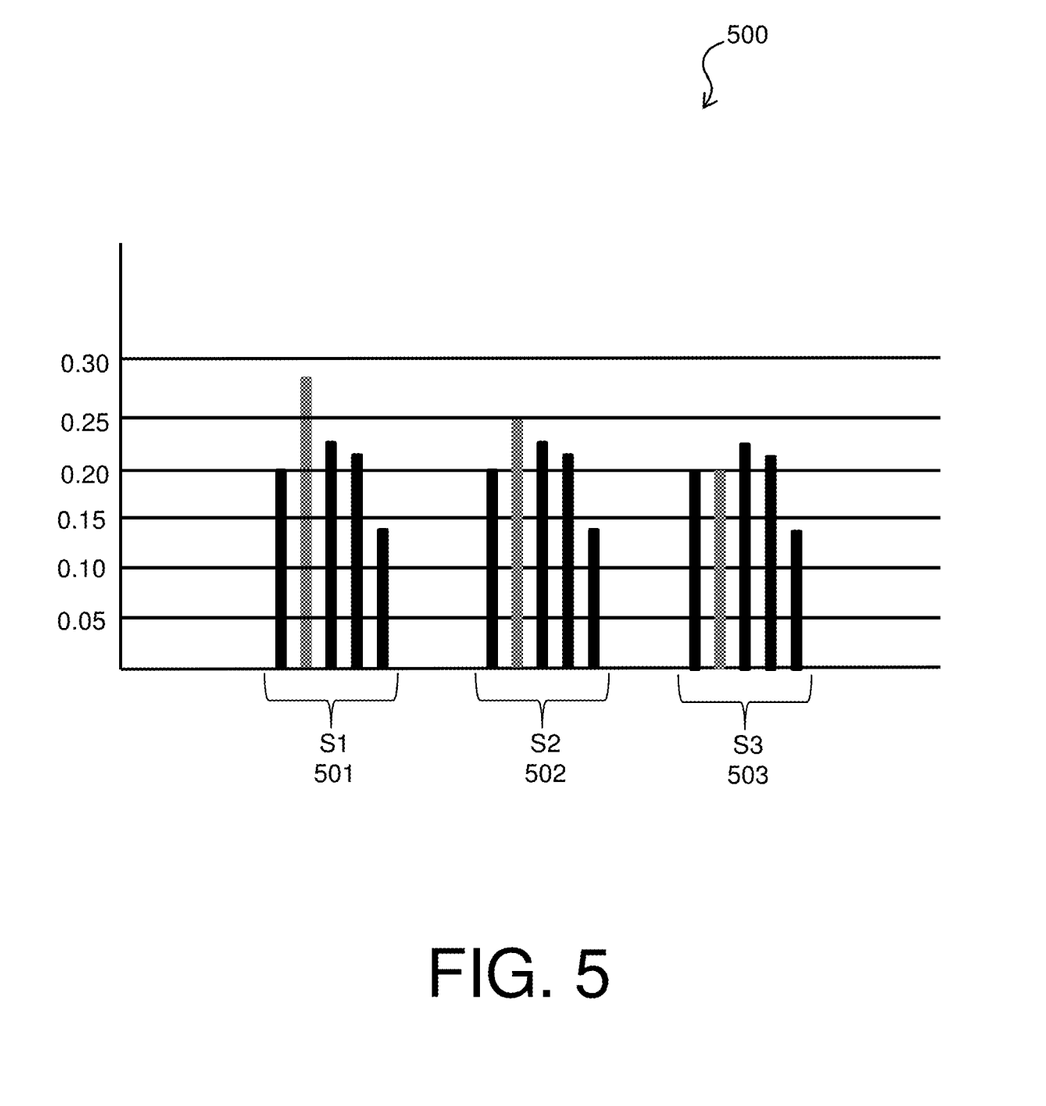
FIG. 5 is a graph of a set of gray level histograms for multistage process model training in accordance with one or more embodiments of the present invention.

FIG. 5 is a graph 500 illustrating a set of gray level histograms for multistage process model training in accordance with one or more embodiments of the present invention. Graph 500 includes gray level histogram 501 for stage 1 (S1, e.g., corresponding to input image 202A of FIG. 2), gray level histogram 502 for stage 2 (S2, e.g., corresponding to input image 202B of FIG. 2), and gray level histogram 503 for stage 3 (S3, e.g., corresponding to input image 202C of FIG. 2). Each of the gray level histograms 501-503 includes 5 gray level values from a respective input image (e.g., M2, M3, M4, M5, and M6). Gray level histograms 501-503 may have been generated in block 302 of method 300 of FIG. 3. As shown in FIG. 5, gray level value M3 (i.e., the second gray level in each of gray level histograms 501-503) is highlighted in each of gray level histograms 501, 502, and 502. In block 304 of FIG. 3, a first change value for M3 may be calculated based on a difference in M3 between gray level histogram 501 and gray level histogram 502, e.g., $\Delta c = -0.03$. A second change value for M3 may be calculated based on a difference in M3 between gray level histogram 502 and gray level histogram 503, e.g., $\Delta c = -0.05$. An absolute value of the first and second change values may be compared to a threshold (e.g., the threshold value may be 0.025). It may be determined that the first change value is greater than the threshold, such that image data corresponding to gray level M3 in the input image 202B is added to the hot zone for training of stage model 201B. It may also be determined that the second change value is greater than the threshold, such that image data corresponding to gray level M3 in the input image 202C is added to the hot zone for training of stage model 201C. Image data corresponding to each of gray levels M2, M4, M5, and M6 may not be included in the hot zone for either of stage model 201B or stage model 201C, as the change values for each of gray levels M2, M4, M5, and M6 are below the threshold, as shown in FIG. 5.

FIG. 5 is shown for illustrative purposes only. A gray level histogram may include any appropriate number of gray levels in various embodiments, and may have any appropriate respective value for each gray level. Further, any appropriate number of gray level histograms may be determined by embodiments of multistage process model training, corresponding to any appropriate number of images, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
   receiving, by a processor, a first input image and a second input image;
   determining a first gray level histogram corresponding to the first input image;
   determining a second gray level histogram corresponding to the second input image;
   determining a set of change values, each change value of the set of change values corresponding to a change in a respective gray level from the first gray level histogram to the second gray level histogram;

comparing each change value of the set of change values to a threshold;

based on determining that a first change value of the set of change values is higher than the threshold, adding a first gray level corresponding to the first change value to a hot zone of the second input image; and training a model to simulate a process using the hot zone of the second input image.

2. The method of claim 1, wherein a training sample comprises a plurality of images, the plurality of images comprising the first input image and the second input image; and wherein the process comprises a multistage manufacturing process, such that each image of the plurality of images corresponds to a respective stage of the multistage manufacturing process.

3. The method of claim 2, wherein the training sample corresponds to processing of a single item by the multistage manufacturing process.

4. The method of claim 2, wherein the model comprises a self-adaptive network model of the multistage manufacturing process and the model is trained based on a plurality of training samples, the method further comprising:

detecting an error in the multistage manufacturing process based on the trained model.

5. The method of claim 2, wherein the first input image corresponds to a first stage of the multistage manufacturing process, the second input image corresponds to a second stage of the multistage manufacturing process, and the first stage directly precedes the second stage in the multistage manufacturing process.

6. The method of claim 1, further comprising:

converting the first gray level histogram from a red blue green (RBG) format to a hue saturation value (HSV) format and converting the second gray level histogram from the RBG format to the HSV format before determining the set of change values.

7. The method of claim 1, further comprising:

based on determining that a second change value of the set of change values is lower than the threshold, excluding a second gray level corresponding to the second change value from the hot zone of the second input image, wherein the model is not trained based on a portion of the second input image corresponding to the second gray level.

8. A system comprising:

a memory having computer readable instructions; and one or more processors for executing the computer readable instructions, the computer readable instructions controlling the one or more processors to perform operations comprising:

receiving a first input image and a second input image;

determining a first gray level histogram corresponding to the first input image;

determining a second gray level histogram corresponding to the second input image;

determining a set of change values, each change value of the set of change values corresponding to a change in a respective gray level from the first gray level histogram to the second gray level histogram;

comparing each change value of the set of change values to a threshold;

based on determining that a first change value of the set of change values is higher than the threshold, adding a first gray level corresponding to the first change value to a hot zone of the second input image; and training a model to simulate a process using the hot zone of the second input image.

9. The system of claim 8, wherein a training sample comprises a plurality of images, the plurality of images comprising the first input image and the second input image; and wherein the process comprises a multistage manufacturing process, such that each image of the plurality of images corresponds to a respective stage of the multistage manufacturing process.

10. The system of claim 9, wherein the training sample corresponds to processing of a single item by the multistage manufacturing process.

11. The system of claim 9, wherein the model comprises a self-adaptive network model of the multistage manufacturing process and the model is trained based on a plurality of training samples; and further comprising:

detecting an error in the multistage manufacturing process based on the trained model.

12. The system of claim 9, wherein the first input image corresponds to a first stage of the multistage manufacturing process, the second input image corresponds to a second stage of the multistage manufacturing process, and the first stage directly precedes the second stage in the multistage manufacturing process.

13. The system of claim 8, further comprising:

converting the first gray level histogram from a red blue green (RBG) format to a hue saturation value (HSV) format and converting the second gray level histogram from the RBG format to the HSV format before determining the set of change values.

14. The system of claim 8, further comprising:

based on determining that a second change value of the set of change values is lower than the threshold, excluding a second gray level corresponding to the second change value from the hot zone of the second input image, wherein the model is not trained based on a portion of the second input image corresponding to the second gray level.

15. A computer program product comprising a computer readable storage medium having program instructions embodied therewith, the program instructions executable by a processor to cause the processor to perform operations comprising:

receiving a first input image and a second input image;

determining a first gray level histogram corresponding to the first input image;

determining a second gray level histogram corresponding to the second input image;

determining a set of change values, each change value of the set of change values corresponding to a change in a respective gray level from the first gray level histogram to the second gray level histogram;

comparing each change value of the set of change values to a threshold;

based on determining that a first change value of the set of change values is higher than the threshold, adding a first gray level corresponding to the first change value to a hot zone of the second input image; and training a model to simulate a process using the hot zone of the second input image.

16. The computer program product of claim 15, wherein a training sample comprises a plurality of images, the plurality of images comprising the first input image and the second input image;

wherein the process comprises a multistage manufacturing process, such that each image of the plurality of images corresponds to a respective stage of the multistage manufacturing process.

17. The computer program product of claim 16, wherein the training sample corresponds to processing of a single item by the multistage manufacturing process.

18. The computer program product of claim 16, wherein the model comprises a self-adaptive network model of the multistage manufacturing process and the model is trained based on a plurality of training samples; and further comprising:
   detecting an error in the multistage manufacturing process based on the trained model.

19. The computer program product of claim 16, wherein the first input image corresponds to a first stage of the multistage manufacturing process, the second input image corresponds to a second stage of the multistage manufacturing process, and the first stage directly precedes the second stage in the multistage manufacturing process.

20. The computer program product of claim 15, further comprising:
   converting the first gray level histogram from a red blue green (RBG) format to a hue saturation value (HSV) format and converting the second gray level histogram from the RBG format to the HSV format before determining the set of change values.

* * * * *